(12) United States Patent
Hatori

(10) Patent No.: US 6,195,198 B1
(45) Date of Patent: Feb. 27, 2001

(54) OPTICAL WAVELENGTH CONVERSION SYSTEM

(75) Inventor: Masami Hatori, Kanagawa-ken (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/096,354

(22) Filed: Jun. 12, 1998

(30) Foreign Application Priority Data

Jun. 12, 1997 (JP) ..................................... 9-155100

(51) Int. Cl.⁷ ................................................ G02F 1/377
(52) U.S. Cl. ............................................. 359/332; 372/21
(58) Field of Search ................................... 359/326–332; 385/122; 372/20–22, 43–45, 50

(56) References Cited

U.S. PATENT DOCUMENTS 5,301,059 * 4/1994 Kitaoka et al. ..................... 359/332
5,387,998 * 2/1995 Kitaoka et al. ..................... 359/328
5,392,308 * 2/1995 Welch et al. ..................... 372/50 X
5,651,018 * 7/1997 Mehuys et al. ..................... 372/50

\* cited by examiner

Primary Examiner—John D. Lee
(74) Attorney, Agent, or Firm—Sughrue, Mion, Zinn, Macpeak & Seas, PLLC

(57) ABSTRACT

An optical wavelength conversion system includes an optical waveguide type optical wavelength conversion element having periodic domain reversals, and a semiconductor laser which generates a laser beam which is caused to enter the optical wavelength conversion element as a fundamental wave. A part of the laser beam is split by a beam splitter upstream of the optical wavelength conversion element, and the split part of the laser beam is reflected by a mirror and fed back to the semiconductor laser. A narrow band pass filter is disposed between the beam splitter and the mirror.

4 Claims, 7 Drawing Sheets

PRIOR ART

F I G. 5
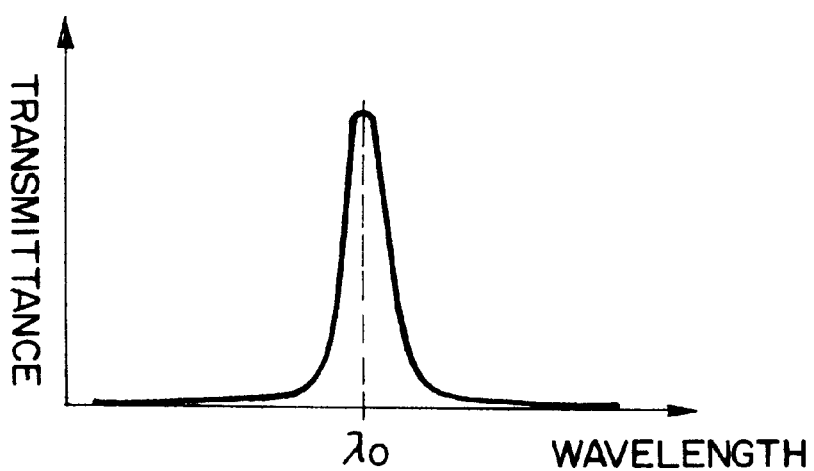
F I G. 6
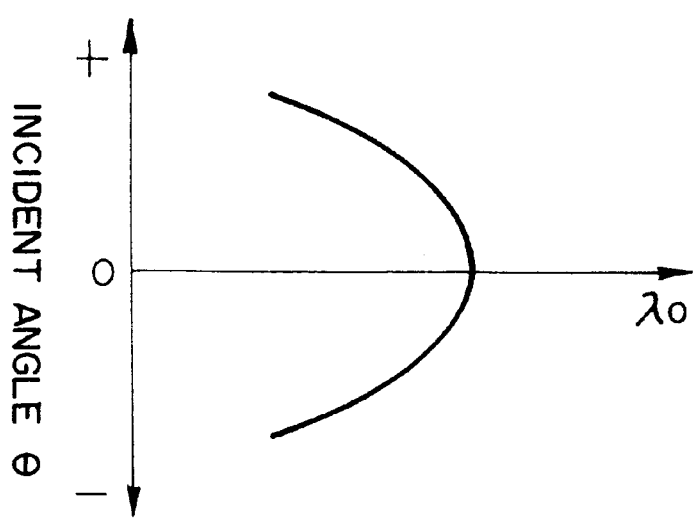

OPTICAL WAVELENGTH CONVERSION SYSTEM

BACKGROUND OF THE INVENTION

1. Field of the Invention

This invention relates to an optical wavelength conversion system which converts the wavelength of a laser beam from a semiconductor laser by use of an optical waveguide type optical wavelength conversion element which converts a fundamental wave to a second harmonic, and more particularly to such an optical wavelength conversion system which converts the wavelength of a laser beam from a semiconductor laser by use of an optical wavelength conversion element comprising an optical waveguide formed on a ferroelectric crystal substrate and periodic domain reversals formed in the optical waveguide.

2. Description of the Related Art

There has been proposed by Bleombergen and et al. a method of converting a fundamental wave to a second harmonic by use of an optical wavelength conversion element formed with a region where the spontaneous polarization (domain) of a ferroelectric material having a nonlinear optical effect is periodically reversed. (See Phys. Rev., vol. 127, No. 6, 1918 (1962)) In this method, by setting pitches $\Lambda$ of the domain reversals to an integer multiple of the coherence length $\Lambda c$ given by formula $\Lambda c = 2\Pi/\{\beta(2\omega) - 2\beta(\omega)\}$, wherein $\beta(2\omega)$ represents the propagation constant of the second harmonic and $\beta(\omega)$ represents the propagation constant of the fundamental wave, phase matching (artificial phase matching) between the fundamental wave and the second harmonic can be obtained.

Further there have been made attempts to efficiently obtain the phase matching in an optical wavelength conversion element, which has an optical waveguide formed of a nonlinear optical material and converts the wavelength of a fundamental wave guided along the optical waveguide, by forming the domain reversals described above. See, for instance, Japanese Unexamined Patent Publication No. 7(1995)-152055.

Such optical waveguide type optical wavelength conversion elements with periodic domain reversals have been often used for wavelength conversion of a laser beam emitted from a semiconductor laser. In this case, unless the oscillation wavelength of the semiconductor laser is a wavelength which is matched in phase with the pitches $\Lambda$ of the domain reversals, the wavelength conversion efficiency significantly deteriorates and it becomes difficult to obtain a short wavelength light source which can be practically used.

Thus, it has been proposed as disclosed, for instance, in the above identified Japanese Unexamined Patent Publication No. 7(1995)-152055 to tune and lock the oscillation wavelength of the semiconductor laser at a desired value by providing a narrow band pass filter in the optical path of the laser beam between the semiconductor laser and the optical wavelength conversion element.

An example such an arrangement is shown in FIG. 4. In FIG. 4, reference numerals 1 to 4 respectively denote a semiconductor laser 1 which generates a laser beam 2 as a fundamental wave, an incident optical system 3, and an optical waveguide type optical wavelength conversion element 4 having a channel optical waveguide 4a and periodic domain reversals 4b. The incident optical system 3 comprises a collimator lens 5 which collimates the laser beam 2 emitted from the semiconductor laser 1 as divergent light, a condenser lens 6 which converges the collimated laser beam 2, a $\lambda/2$ plate 7 for polarization control disposed between the lenses 5 and 6, and a narrow band pass filter 8, which may be, for instance, a dielectric multi-layered film filter.

Such a narrow band pass filter 8 has spectral transmission properties which are substantially as shown in FIG. 5. Further the peak transmission wavelength $\lambda 0$ in the properties generally depends upon the light incident angle $\theta$ to the band pass filter 8 as shown in FIG. 6. The laser beam 2 passing through the band pass filter 8 with such properties is converged on the light incident end face of the optical waveguide 4a by the condenser lens 6 and is divided into a component which enters the optical waveguide 4a in a TM mode and a component which is reflected at the light incident end face of the optical waveguide 4a.

The laser beam 2 input into the waveguide 4a is converted to its second harmonic 9 after passing through the periodic domain reversals 4b. On the other hand, the laser beam 2 reflected at the light incident end face of the optical waveguide 4a is fed back to the semiconductor laser 1 retracing its optical path to the waveguide 4a, and resonates between the light incident end face and the rear end face of the semiconductor laser 1, whereby the semiconductor laser 1 comes to oscillate at a wavelength of $\lambda 0$.

Since the peak transmission wavelength $\lambda 0$ of the band pass filter 8 depends upon the light incident angle $\theta$ to the band pass filter 8 as shown in FIG. 6, the oscillating wavelength of the semiconductor laser 1 can be tuned and locked at a value which is matched in phase with the pitches $\Lambda$ of the domain reversals by rotating the band pass filter 8 as shown by arrow A in FIG. 4.

However, in the conventional system, even if the laser beam 2 has correctly impinged upon the light incident end face of the waveguide 4a until tuning as shown in FIG. 7A, the optical path of the laser beam 2 can be inclined as shown by the dashed line in FIG. 7B when the band pass filter 8 is rotated for tuning. This is due to the fact that the band pass filter 8 is not of a perfect parallel plate and that the laser beam 2 has not been perfectly collimated.

When the optical path of the laser beam 2 is inclined, the position on the incident end face of the waveguide 4a in which the laser beam 2 is converged is shifted. Though being small, the shift results in poor optical coupling efficiency of the laser beam to the optical waveguide and poor output of the wavelength-converted wave since the waveguide is generally as small as 2 to 3 $\mu$m in diameter. At the worst, the amount of light entering the waveguide can become extremely small to such an extent that tuning the oscillation wavelength becomes impossible.

Further in the conventional system, there has been a problem that since production of a band pass filter which is high in transmittance is difficult, the amount of light entering the waveguide is apt to be small and accordingly it is difficult to obtain a high output wavelength-converted wave.

Specifically, in order to cause a semiconductor laser to oscillate in a single longitudinal mode, the transmission wavelength half-amplitude level of the band pass filter generally should be not larger that 0.5 nm. Very high film forming technique is required to form a band pass filter with such a transmission wavelength half-amplitude level and a high transmittance by multilayered film forming technic. For example, when trying to produce a band pass filter with a transmission wavelength half-amplitude level of 0.5 nm and a transmittance of not lower than 80% by conventional multilayered film forming technique, yield in the film forming process becomes very low, which results in a very expensive band pass filter. According to the conventional ordinary film forming technic, the transmittance of a band pass filter whose transmission wavelength half-amplitude level is 0.5 nm can be up to about 30% and accordingly the output of the wavelength-converted wave is very poor.

SUMMARY OF THE INVENTION

In view of the foregoing observations and description, the primary object of the present invention is to provide an optical wavelength conversion system which converts the wavelength of a laser beam from a semiconductor laser by use of an optical waveguide type optical wavelength conversion element having periodic domain reversals in which the oscillation wavelength of the semiconductor laser can be correctly locked to a wavelength which is matched in phase with the pitches of the domain reversals, thereby ensuring a high output of the wavelength-converted wave.

Another object of the present invention is to accomplish the above object by use of an inexpensive band pass filter.

In accordance with a first aspect of the present invention, there is provided an optical wavelength conversion system comprising an optical waveguide type optical wavelength conversion element having periodic domain reversals, and a semiconductor laser which generates a laser beam which is caused to enter the optical wavelength conversion element as a fundamental wave, wherein the improvement comprises that a part of the laser beam is split by an optical splitting means upstream of the optical wavelength conversion element, the split part of the laser beam is reflected by a mirror and fed back to the semiconductor laser, and a narrow band pass filter is disposed between the optical splitting means and the mirror.

It is preferred that the optical splitting means permits 50 to 90% of the laser beam impinging thereon to enter the optical wavelength conversion element and causes the other part of the laser beam to impinge upon the mirror. The optical splitting means is preferably a beam splitter.

In accordance with a second aspect of the present invention, there is provided an optical wavelength conversion system which comprises an optical wavelength conversion element and a semiconductor laser similar to those in the optical wavelength conversion system of the first aspect and is characterized in that a laser beam emanating from the semiconductor laser as a rearward radiated laser beam in the direction opposite to the laser beam to be wavelength-converted is reflected by a mirror and fed back to the semiconductor laser, and a narrow band pass filter is disposed in the optical path of the rearward radiated laser beam.

In accordance with a third aspect of the present invention, there is provided an optical wavelength conversion system which comprises an optical wavelength conversion element and a semiconductor laser similar to those in the optical wavelength conversion system of the first aspect and is characterized in that wherein the improvement comprises that a part of the laser beam is split by an optical splitting means upstream of the optical wavelength conversion element.

the split part of the laser beam is reflected by a mirror and fed back to the semiconductor laser, and a narrow band pass filter consisting of a birefringent filter, an etalon, a dielectric multi-layered film filter or a combination of these optical elements is disposed between the optical splitting means and the mirror.

In any one of the optical wavelength conversion systems, the oscillation wavelength of the semiconductor laser can be tuned and locked by rotation of the band pass filter as in the conventional system.

In the optical wavelength conversion system in accordance with the first aspect of the present invention, since the laser beam passing through the band pass filter is not caused to enter the optical wavelength conversion element but the laser beam passing through the optical splitting means, which may be a beam splitted whose transmittance can be up to 70 to 90%, is caused to enter the same, the amount of light entering the optical wavelength conversion element is assuredly large and accordingly a high output wavelength-converted wave can be obtained.

Since the laser beam passing through the band pass filter is not caused to enter the optical wavelength conversion element, the band pass filter may be an inexpensive one whose transmittance is about 30% without fear of deterioration in output of the wavelength-converted wave. When such an inexpensive band pass filter can be used, the optical wavelength conversion system can be manufactured at low cost.

In the optical wavelength conversion system in accordance with the second aspect of the present invention, since only the rearward radiated laser beam passes through the band pass filter and basically the entire laser beam to be wavelength-converted (forward radiated laser beam) is caused to enter the optical wavelength conversion element, the amount of light entering the optical wavelength conversion element is assuredly large and accordingly a high output wavelength-converted wave can be obtained.

In the optical wavelength conversion system of the second aspect, if the reflectivity of the rear end face of the semiconductor laser is as low as substantially 0%, the semiconductor laser itself cannot oscillate and laser oscillation occurs between the mirror which reflects the rearward radiated laser beam and the front end face of the semiconductor laser with the mirror and the front end face functioning as an external resonator. In such a case, if the transmittance of the band pass filter, which is disposed between the mirror and the semiconductor laser, is too low, the internal light power in the resonator lowers and the oscillation efficiency lowers. If so, the amount of the forward radiated laser beam becomes poor and the output of the wavelength-converted wave becomes poor. Accordingly, it is not preferred to use a band pass filter whose transmittance is too low.

On the other hand, if the reflectivity of the rear end face of the semiconductor laser is about 2 to 3% in the optical wavelength conversion system of the second aspect, the semiconductor laser itself oscillates and the amount of the forward radiated laser beam is kept substantially constant irrespective of whether the mirror reflecting the rearward radiated laser beam forms an external resonator. That is, in this case, since the light beam from the external resonator only perturbingly acts on the semiconductor laser, the transmittance of the band pass filter hardly affects the amount of the forward radiated laser beam and/or the output of the wavelength-converted wave.

Further, in any one of the optical wavelength conversion systems of the present invention, since only the laser beam for tuning the oscillation wavelength passes through the band pass filter and the laser beam to be wavelength-converted enters the optical wavelength conversion element independently from the band pass filter, inclination of the optical path of the laser beam due to rotation of the band pass filter for tuning the oscillation wavelength affects neither the amount of light entering the optical wavelength conversion element nor the output of the wavelength-converted wave.

Especially in the optical wavelength conversion system of the second aspect, since the band pass filter is disposed outside the semiconductor laser and the optical wavelength conversion element, rotation of the band pass filter for tuning the oscillation wavelength does not affect the coupling efficiency of the fundamental wave to the optical waveguide of the optical wavelength conversion element. Accordingly, the wavelength of the fundamental wave can be easily tuned to a wavelength which is matched in phase with the pitches of the domain reversals with the coupling efficiency of the fundamental wave to the optical waveguide kept high, whereby an extremely high wavelength conversion efficiency can be realized.

In the optical wavelength conversion system of the third aspect, when a birefringent filter, an etalon or a combination of a birefringent filter and an etalon is used, wavelength locking is facilitated and a higher output second harmonic can be obtained since the birefringent filter and the etalon are higher in transmittance (not lower than 98%) and smaller in loss than the dielectric multi-layered film filter.

BRIEF DESCRIPTION OF THE DRAWINGS

FIG. 5 is a schematic view showing the spectral transmission properties of a narrow band pass filter, FIG. 6 is a schematic view showing the peak transmission wavelength versus the incident angle.

DESCRIPTION OF THE PREFERRED EMBODIMENTS

Figure 1:
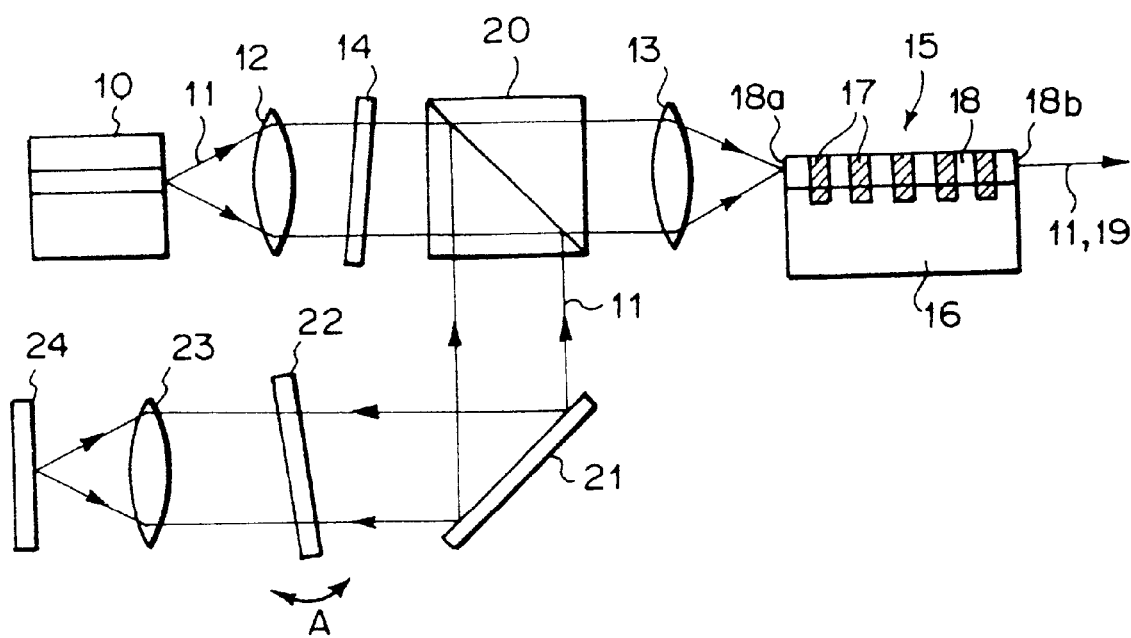
FIG. 1 is a schematic side view of an optical wavelength conversion system in accordance with a first embodiment of the present invention.

In FIG. 1, an optical wavelength conversion system in accordance with a first embodiment of the present invention comprises a semiconductor laser (a laser diode) 10 which generates a laser beam 11, a collimator lens 12 which collimates the laser beam 11 emitted from the semiconductor laser 10 as divergent light, a condenser lens 13 which converges the collimated laser beam 11, a $\lambda/2$ plate 14 for polarization control disposed between the lenses 12 and 13, a beam splitter 20 disposed between the $\lambda/2$ plate 14 and the condenser lens 13, and an optical wavelength conversion element 15.

A mirror 21 is disposed in a position where the laser beam 11 reflected at the beam splitter 20 impinges. A narrow band pass filter 22, a condenser lens 23 and a mirror 24 are disposed so that the laser beam 11 reflected by the mirror 21 travels through the band pass filter 22 and the condenser lens 23 and impinges upon the mirror 24. The band pass filter 22 may be for instance a dielectric multi-layered film filter which is 30% in transmittance and relatively inexpensive.

Figure 2:
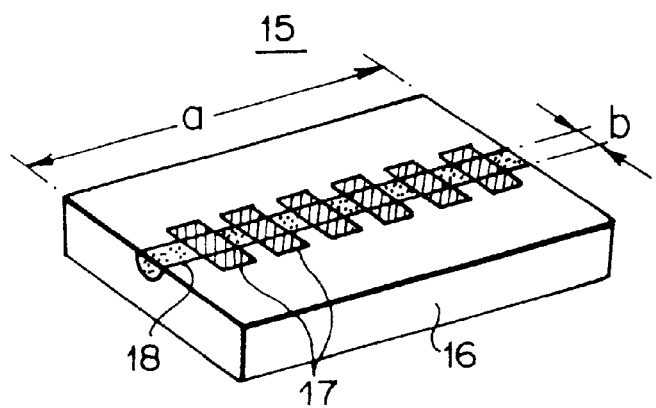
FIG. 2 is a perspective view of the optical wavelength conversion element employed in the optical wavelength conversion system of FIG. 1.

As shown in FIG. 2, the optical wavelength conversion element 15 comprises a MgO-LN (LiNbO$_3$ doped with MgO) crystal substrate 16 which is a ferroelectric material having a nonlinear optical effect. The substrate 16 is formed with a periodic domain reversals 17 which is a region on the substrate 16 where the spontaneous polarization parallel to Z-axis is periodically reversed and with a channel optical waveguide 18 extending along the periodic domain reversals 17.

The MgO-LN crystal substrate 16 may be, for instance, one doped with 5 mol % of MgO. The periodic domain reversals 17 are formed so that the domain reversals are arranged in the direction of X-axis of the substrate 16, and the pitches $\Lambda$ of the periodic domain reversals are 5.3 $\mu$m so that the pitches $\Lambda$ come to be of a first order to wavelengths near 980 nm taking into account the dispersion of the refractive index with wavelength of MgO-LN. In this particular embodiment, the periodic domain reversals 17 extend in a length of 10 mm (dimension a in FIG. 2). Such periodic domain reversals can be formed in various ways as disclosed, for instance, in U.S. Pat. Nos. 5,568,308; 5,522,973 and 5,570,225.

The channel optical waveguide 18 may be formed, for instance, by, after formation of the periodic domain reversals 17, forming a metal mask on +Z-face of the substrate 16 by known photolithography and dry etching, subjecting the substrate 16 to proton exchange in pyrophosphoric acid, removing the mask and subjecting the substrate 16 to an annealing treatment. Then the optical wavelength conversion element 15 is finished by subsequently edge-grinding the both end faces 18$a$ and 18$b$ of the channel optical waveguide 18.

For instance, the proton exchange may be carried out at 170° C. for 68 minutes. The annealing treatment may be carried out at 350 to 370° C. for 1 to 2 hours. The channel optical waveguide 18 may be, for instance, 6 to 9 $\mu$m in width (b in FIG. 2).

In this particular embodiment, the semiconductor laser 10 generates a laser beam 11 of a wavelength near 980 nm. The laser beam 11 is collimated by the collimator lens 12, the direction of polarization of the collimated laser beam 11 is changed to conform to the direction of Z-axis of the optical waveguide 18 by the $\lambda/2$ plate 14 and then the laser beam 11 impinges upon the beam splitter 20. The beam splitter 20 is 70% in transmittance and 70% of the laser beam 11 impinging thereupon passes through the beam splitter 20.

The laser beam 11 passing through the beam splitter 20 is condensed by the condenser lens 18 and converges on the end face 18$a$ of the channel optical waveguide 18. Thus the laser beam 11 enters the optical waveguide 18 and propagates along the waveguide 18.

The laser beam 11 which travels in a waveguide mode as a fundamental wave undergoes phase matching (so-called quasi phase matching) in the region of periodic domain reversals in the optical waveguide 18 and is converted to its second harmonic 19 of 490 nm. Also the second harmonic 19 propagates along the waveguide 18 in a waveguide mode and emanates through the end face 18b of the waveguide 18.

On the other hand, the part of the laser beam 11 reflected at the beam splitter 20 is further reflected at the mirror 21, passes through the narrow band pass filter 22 and is caused to converge on the mirror 24 by the condenser lens 23. The laser beam 11 is reflected by the mirror 24 to be fed back to the semiconductor laser 10 retracing the same optical path to the mirror 24 in the opposite direction. The condenser lens 23 may be eliminated and the laser beam 11 may be caused to impinge upon the mirror 24 in the collimated state. However, in this case, since the mirror 24 and the rear end face of the semiconductor laser 10 do not form a confocal optical system, the angle of the mirror 24 must be accurately adjusted so that the amount of light fed back to the semiconductor laser 10 is maximized.

Figure 4:
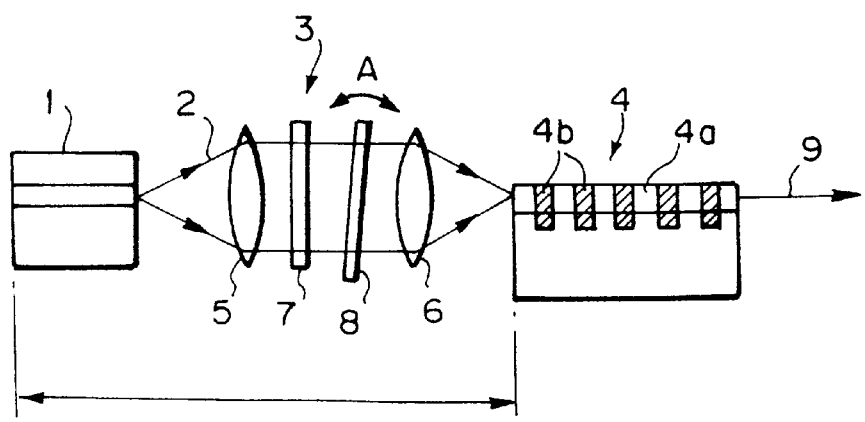
FIG. 4 is a schematic side view of an optical wavelength conversion system in accordance with a prior art.
Figure 7A:
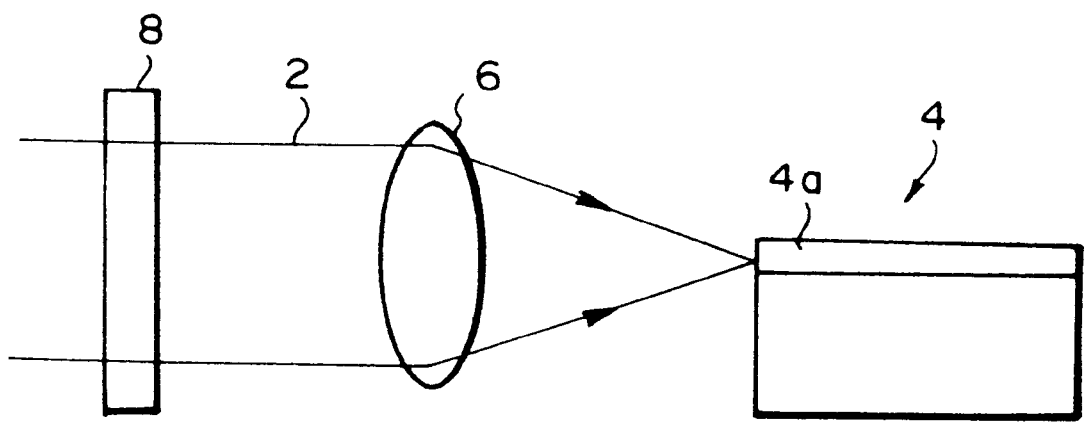
FIGS. 7A and 7B are views for illustrating deterioration in the optical coupling efficiency of the fundamental wave to the optical wavelength conversion element in the conventional optical wavelength conversion system.
Figure 7B:
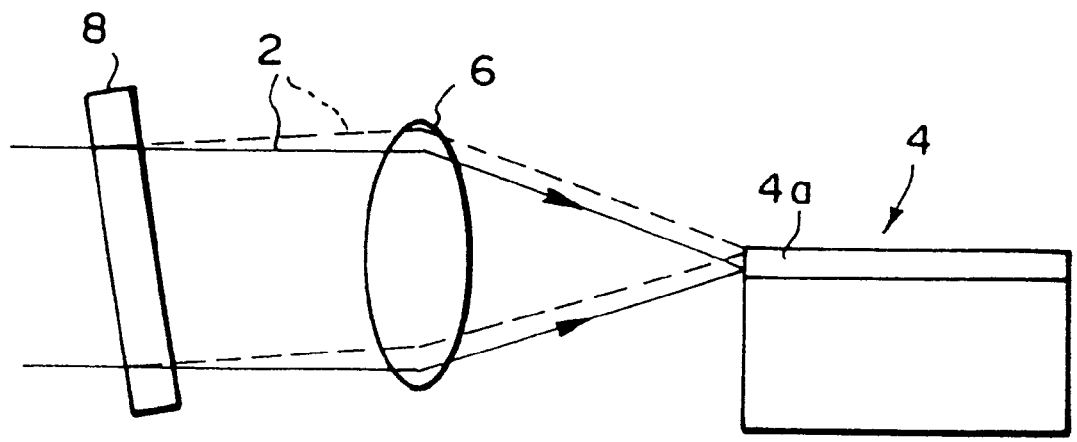

By rotating the band pass filter 22 in a direction indicated by arrow A in FIG. 1, only a part of the laser beam 11 having a predetermined wavelength can be fed back to the semiconductor laser 10. The reason is basically the same as that described above in conjunction with the conventional system shown in FIG. 4 except that in this embodiment, the rear end face of the semiconductor laser 10 and the mirror 24 form an external resonator for the semiconductor laser 10.

When the laser beam 11 of a predetermined wavelength only is fed back to the semiconductor laser 10, the semiconductor laser 10 comes to oscillate at the predetermined wavelength. Accordingly, by properly rotating the band pass filter 22, the oscillation wavelength of the semiconductor laser 10 can be tuned and locked to a desired wavelength which is matched in phase with the pitches Λ of the periodic domain reversals 17.

In the optical wavelength conversion system of this embodiment, since the laser beam 11 passing through the band pass filter 22 which is low in transmittance is caused not to enter the optical wavelength conversion element 15 and the laser beam 11 passing through the beam splitter 20 which is high in transmittance (70%) is caused to enter the optical wavelength conversion element 15, the amount of light entering the optical wavelength conversion element 15 can be ensured high, thereby obtaining a high output second harmonic 19.

If the laser beam 11 passing through the band pass filter 22 does not enter the optical wavelength conversion element 11, the band pass filter 22 may be an inexpensive one whose transmittance is only about 30% without fear of deterioration in output of the second harmonic 19. When such an inexpensive band pass filter can be used, the optical wavelength conversion system can be manufactured at relatively low cost.

Further in the optical wavelength conversion system of this embodiment, since only the laser beam 11 for tuning the oscillation wavelength passes through the band pass filter 22 and the laser beam 11 to be wavelength-converted enters the optical wavelength conversion element 15 independently from the band pass filter 22, inclination of the optical path of the laser beam 11 due to rotation of the band pass filter 22 for tuning the oscillation wavelength affects neither the amount of light entering the optical wavelength conversion element 15 nor the output of the second harmonic 19.

The output of the second harmonic 19 and the like will be described by specific values, hereinbelow. In the optical wavelength conversion system of the first embodiment, a semiconductor laser 10 of 100 mW was used, and the oscillation wavelength of the semiconductor laser 10 was locked to 983 nm instead of 980 nm which is matched with the pitches Λ of the periodic domain reversals 17.

The output of the laser beam 11 collimated by the collimator lens 12 was 90 mW due to loss at the collimator lens 12. Further the output of the laser beam 11 after passing through the λ/2 plate 14 and the beam splitter 20 was 63 mW due to the transmittance of the beam splitter 20 (70%). In this case, the output of the laser beam 11 from the optical wavelength conversion element 15 was 41 mW. Accordingly the optical coupling efficiency of the laser beam 11 to the waveguide 18 was estimated at about 65%.

Then the band pass filter 22 was rotated to set the oscillation wavelength of the semiconductor laser 10 at a wavelength which was matched with the pitches Λ of the periodic domain reversals 17. In response to rotation of the band pass filter 22, the output of the second harmonic 19 was gradually increased up to about 1 mW. The oscillation wavelength of the semiconductor laser 10 at the maximum output of the second harmonic 19 was 980 nm, a wavelength which was matched with the pitches Λ of the periodic domain reversals 17. Further the output of the laser beam 11 (the fundamental wave) from the optical wavelength conversion element 15 was 40 mW.

Thus it has been proved that in this embodiment, rotation of the band pass filter 22 for tuning the oscillation wavelength of the semiconductor laser 10 does not deteriorate the optical coupling efficiency of the laser beam 11 to the waveguide 18 unlike the conventional system.

In the example described above, the semiconductor laser 10 was DC-driven. With such drive method, several to several tens % of noise in the amount of light (fluctuation in the level of the amount of light) in the low frequency rage (not higher than MHz order) due to the semiconductor laser 10 itself was observed. This is due to the fact that the level of the amount of light was not stabilized. (Since the wavelength was locked, no fluctuation due to fluctuation in wavelength occurred.) It has been known that such noise can be suppressed by driving the semiconductor laser at a high frequency. Then the semiconductor laser 10 was driven at a high frequency of 0.1 to 1 GHz. The result was fluctuation in the amount of light of not larger than 1%.

Further the oscillation wavelength of the semiconductor laser 10 is stably locked when the transmittance of the beam splitter 20 is in the range of 50 to 90%. When the transmittance of the beam splitter 20 exceeds 90%, locking of the oscillation wavelength becomes somewhat unstable.

Figure 3:
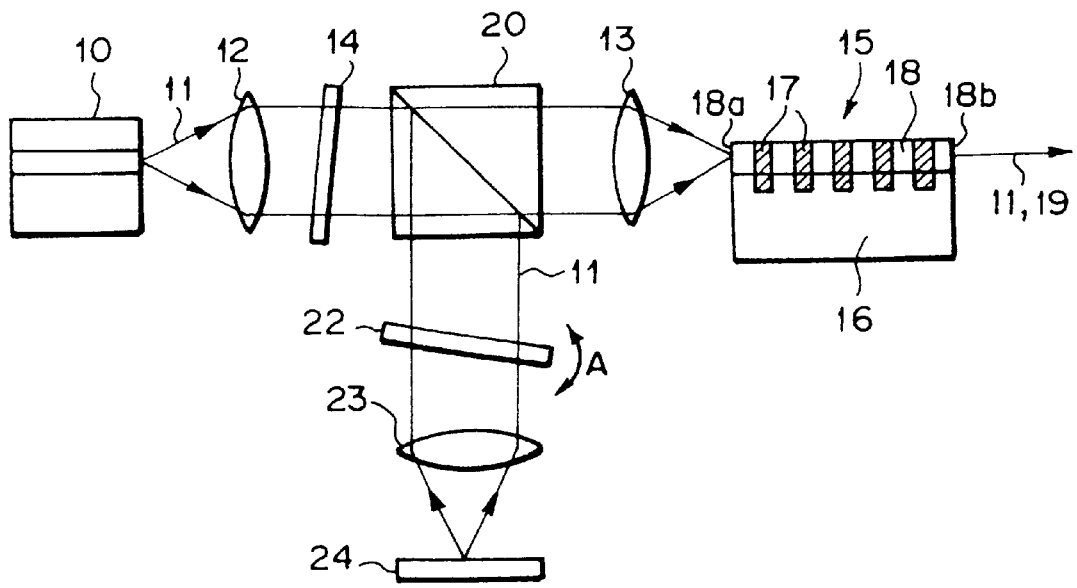
FIG. 3 is a schematic side view of an optical wavelength conversion system in accordance with a second embodiment of the present invention.

A second embodiment of the present invention will be described with reference to FIG. 3, hereinbelow. In FIG. 3, the elements analogous to those shown in FIGS. 1 and 2 are given the same reference numerals and will not be described here unless necessary.

In the optical wavelength conversion system shown in FIG. 3, the optical path of the laser beam 11 reflected at the beam splitter 20 is not bent by a mirror such as the mirror 21 in FIG. 1, and the laser beam 11 reflected at the beam splitter 20 directly impinges upon the band pass filter 22 and then impinges upon the mirror 24 through the condenser lens 23.

In the case where the optical path of the laser beam 11 reflected at the beam splitter 20 is bent by a mirror, the optical path may be bent in various directions, e.g., to right as seen in FIG. 1.

In the embodiment described above, the MgO-LN crystal substrate 16 is a Z-cut substrate (Z-cut plate), and the orientation of the spontaneous polarization is perpendicular to the surface of the substrate. However, it is possible to use a substrate which has been cut so that the orientation of the spontaneous polarization is not perpendicular to the surface of the substrate and to form periodic domain reversals by directly imparting an electric field to the substrate as disclosed in our Japanese Unexamined Patent Publication No. 8(1996)-47591.

Figure 8:
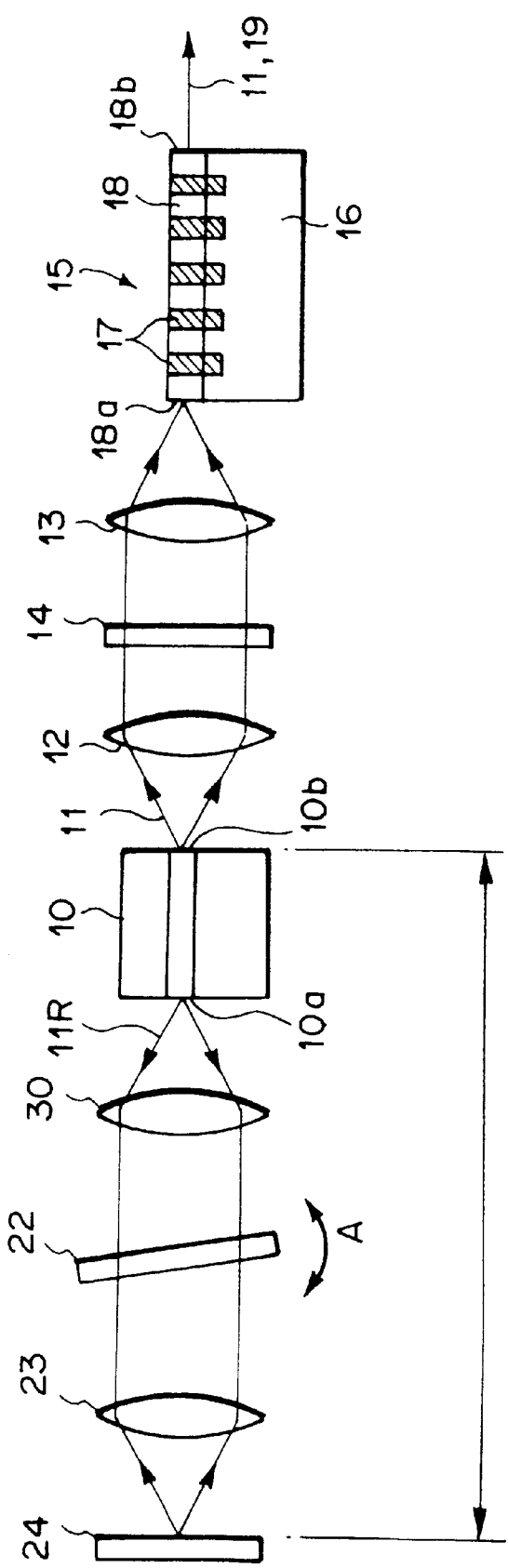
FIG. 8 is a schematic side view of an optical wavelength conversion system in accordance with a third embodiment of the present invention.

In the optical wavelength conversion system in accordance with a third embodiment of the present invention shown in FIG. 8, a laser beam 11 emanating from the semiconductor laser 10 forward (rightward in FIG. 8) is caused to impinge upon the optical wavelength conversion element 15 without being split. The laser beam 11 entering the optical wavelength conversion element 15 is converted to its second harmonic 19 basically in the same manner as in the first embodiment.

A laser beam 11R is also emitted from the semiconductor laser 10 rearward, i.e., leftward in FIG. 8. The laser beam 11R is generally referred to as "rearward radiated laser beam" and emanates from the semiconductor laser as divergent light. The rearward radiated laser beam 11R is collimated by a collimator lens 30, passes through the narrow band pass filter 22 and then is converged by the condenser lens 23 on the mirror 24. Almost the entire rearward radiated laser beam 11R is reflected by the mirror 24 to be fed back to the semiconductor laser 10 retracing the same optical path to the mirror 24 in the opposite direction.

Also in this embodiment, by rotating the band pass filter 22 in a direction indicated by arrow A in FIG. 8, only a part of the laser beam 11R having a predetermined wavelength can be fed back to the semiconductor laser 10. However in the case of this embodiment, the front end face 10b of the semiconductor laser 10 and the mirror 24 form an external resonator for the semiconductor laser 10. Accordingly the reflectivity of the rear end face 10a of the semiconductor laser 10 is set, for instance, at 0 to 3% and the reflectivity of the front end face 10b is set higher, e.g., about 10 to 20%.

When the laser beam 11R of a predetermined wavelength only is fed back to the semiconductor laser 10, the semiconductor laser 10 comes to oscillate at the predetermined wavelength. Accordingly, by properly rotating the band pass filter 22, the oscillation wavelength of the semiconductor laser 10 can be tuned and locked to a desired wavelength which is matched in phase with the pitches Λ of the periodic domain reversals 17.

Further also in the optical wavelength conversion system of this embodiment, since only the laser beam 11R for tuning the oscillation wavelength passes through the band pass filter 22 and the laser beam 11 to be wavelength-converted enters the optical wavelength conversion element 15 independently from the band pass filter 22, inclination of the optical path of the laser beam 11R due to rotation of the band pass filter 22 for tuning the oscillation wavelength affects neither the amount of light entering the optical wavelength conversion element 15 nor the output of the second harmonic 19.

The output of the second harmonic 19 and the like in the third embodiment will be described by specific values, hereinbelow. In the optical wavelength conversion system of the third embodiment, the oscillation wavelength of the semiconductor laser 10 was locked to 983 nm instead of 980 nm which is matched with the pitches Λ of the periodic domain reversals 17.

In this case, the output of the laser beam 11 (the fundamental wave) from the optical wavelength conversion element 15 was 40 mW.

Then the band pass filter 22 was rotated to set the oscillation wavelength of the semiconductor laser 10 at a wavelength which was matched with the pitches Λ of the periodic domain reversals 17. In response to rotation of the band pass filter 22, the output of the second harmonic 19 was gradually increased up to about 1 mW. The oscillation wavelength of the semiconductor laser 10 at the maximum output of the second harmonic 19 was 980 nm, a wavelength which was matched with the pitches Λ of the periodic domain reversals 17. Further the output of the laser beam 11 (the fundamental wave) from the optical wavelength conversion element 15 was about 39 mW.

Thus it has been proved that also in this embodiment, rotation of the band pass filter 22 for tuning the oscillation wavelength of the semiconductor laser 10 does not deteriorate the optical coupling efficiency of the laser beam 11 to the waveguide 18 unlike the conventional system. In other words, a high wavelength conversion efficiency can be obtained without changing the optical coupling efficiency of the fundamental wave to the waveguide.

Figure 9:
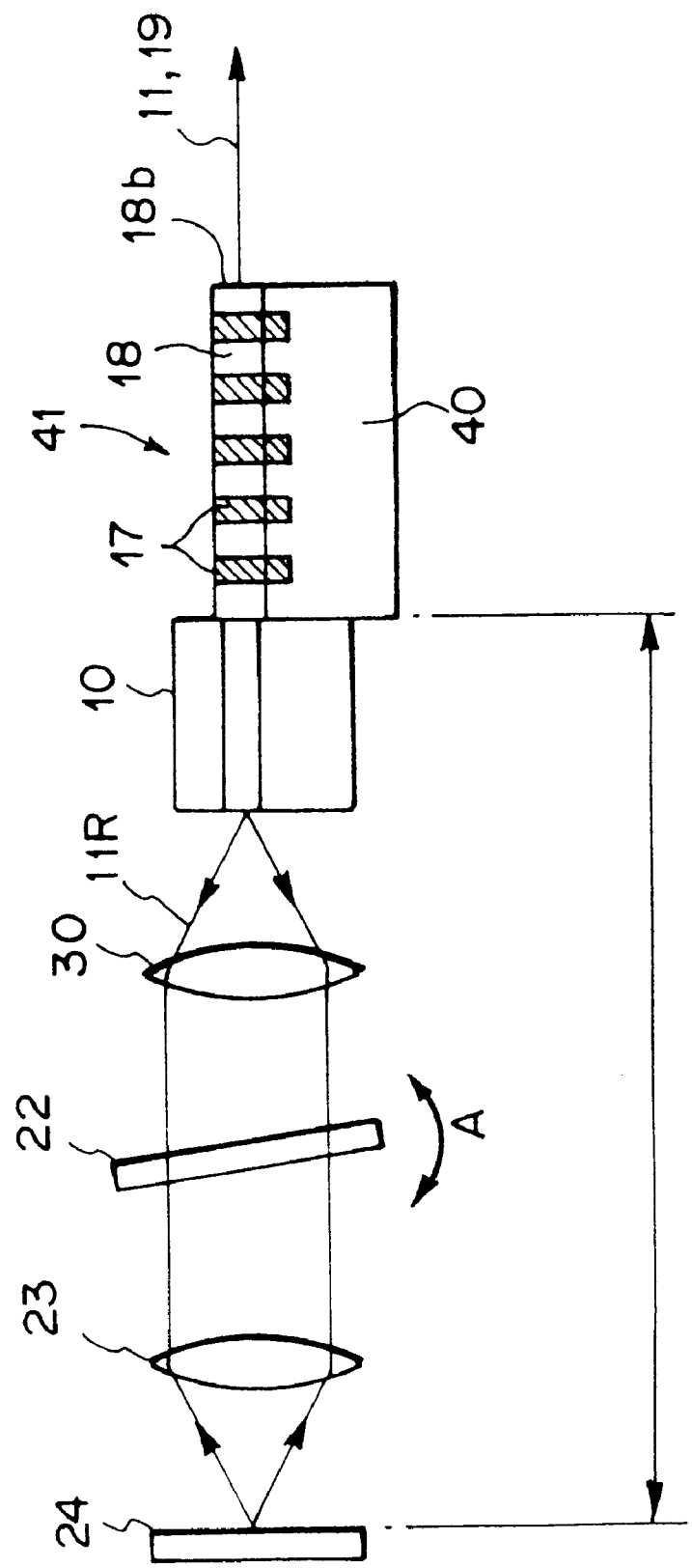
FIG. 9 is a schematic side view of an optical wavelength conversion system in accordance with a fourth embodiment of the present invention.

The optical wavelength conversion system in accordance with a fourth embodiment of the present invention shown in FIG. 9 differs from the third embodiment shown in FIG. 8 in that the semiconductor laser 10 is directly coupled to the light incident end face of the optical wavelength conversion element 41. Such an optical wavelength conversion element can be small in both weight and size due to a reduced number of optical components and is optically stable since the optical axes of the components are well in alignment with each other.

When the semiconductor laser 10 is directly coupled to the light incident end face of the optical wavelength conversion element 41, no polarization control element such as a λ/2 plate cannot be disposed between the semiconductor laser 10 and the optical wavelength conversion element 41. Accordingly, if the optical wavelength conversion element is formed of a Z-cut substrate and TM mode waveguide is employed as in the embodiment shown in FIG. 1, it is necessary to rotate the semiconductor laser 10 by 90° from the position shown in FIG. 1 in order to cause the direction of polarization of the laser beam 11 to conform to the direction of Z-axis of the channel optical waveguide 18, which results in different laser beam patterns in the semiconductor laser 10 and the channel optical waveguide 18 and deteriorates the optical coupling efficiency.

Thus when the semiconductor laser 10 is directly coupled to the light incident end face of the optical wavelength conversion element, it is advantageous in maintaining high the optical coupling efficiency to use an optical wavelength conversion element of a TE mode waveguide type which does not require rotation of the direction of polarization of the laser beam 11. For this reason, in this embodiment, the optical wavelength conversion element 41 is of a TE mode waveguide type having a X-cut MgO-LN crystal substrate 40 wherein the direction Z-axis is parallel to the surface of the substrate 40.

The TE mode waveguide type optical wavelength conversion element can also be obtained by use of a Y-cut substrate where the direction of Z-axis is also parallel to the surface of the substrate. Further it is possible to obtain a TE mode waveguide type optical wavelength conversion element by use a substrate which has been cut so that the orientation of the spontaneous polarization is not perpendicular to the surface of the substrate and by forming periodic domain reversals by directly imparting an electric field to the substrate as disclosed in our Japanese Unexamined Patent Publication No. 8(1996)-47591.

Figure 10:
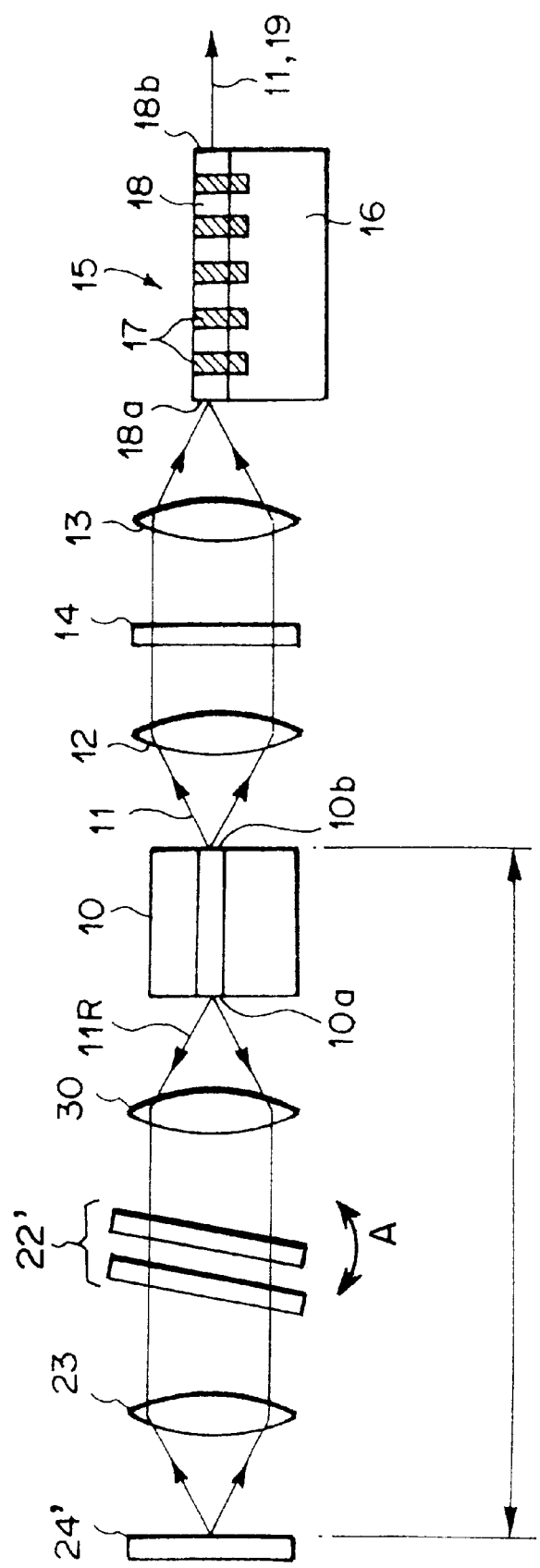
FIG. 10 is a schematic side view of an optical wavelength conversion system in accordance with a fifth embodiment of the present invention.

An optical wavelength conversion system in accordance with a fifth embodiment will be described with reference to FIG. 10. The optical wavelength conversion system of this embodiment is basically the same as that shown in FIG. 8 but a birefringent filter 22' is employed as the band pass filter 22 and a dielectric mirror 24' is employed as the mirror 24. Since the birefringent filter 22' is higher in transmittance than the dielectric multi-layered film filter, a plurality of birefringent filters can be inserted without increasing loss, whereby wavelength locking can be more sure and the output power of the incident light to the waveguide of the semiconductor laser can be increased and a higher output second harmonic can be obtained. In place of the birefringent filter, an etalon may be employed. Further it is possible to insert a combination of a birefringent filter, an etalon and dielectric multi-layered film filter. Further when a multi-layered film mirror which is relatively narrow in band width is employed as the dielectric mirror 24', the effective gain width of the semiconductor laser beam is narrowed, whereby the number of the birefringent filters and/or the etalons can be reduced to make higher the overall transmittance. As a result, wavelength locking can be made more surely and the output of the second harmonic can be further increased.

The same modification can be made also to the arrangement shown in FIGS. 1 and 3.

What is claimed is:

1. An optical wavelength conversion system comprising
   an optical wavelength conversion element having an optical waveguide which is formed on a ferroelectric crystal substrate having a nonlinear optical effect, and domain reversals which are periodically formed in the optical waveguide and arranged in a direction, the orientation of the spontaneous polarization of the substrate being reversed in the domain reversals and the optical wavelength conversion element being for converting the wavelength of a fundamental wave travelling in the direction of arrangement of the domain reversals under the guidance of the optical waveguide,
   a semiconductor laser which generates a laser beam which is caused to enter the optical wavelength conversion element as the fundamental wave,
   an optical splitting means which splits a part of the laser beam upstream of the optical wavelength conversion element,
   a mirror which reflects and feeds the split part of the laser beam back to the semiconductor laser, and
   a narrow band pass filter disposed in the optical path of the laser beam between the optical splitting means and the mirror.

2. An optical wavelength conversion system as defined in claim 1 in which the optical splitting means permits 50 to 90% of the laser beam impinging thereon to enter the optical wavelength conversion element and causes the other part of the laser beam to impinge upon the mirror.

3. An optical wavelength conversion system as defined in claim 1 in which the optical splitting means is a beam splitter.

4. An optical wavelength conversion system comprising
   an optical wavelength conversion element having an optical waveguide which is formed on a ferroelectric crystal substrate having a nonlinear optical effect, and domain reversals which are periodically formed in the optical waveguide and arranged in a direction, the orientation of the spontaneous polarization of the substrate being reversed in the domain reversals and the optical wavelength conversion element being for converting the wavelength of a fundamental wave travelling in the direction of arrangement of the domain reversals under the guidance of the optical waveguide,
   a semiconductor laser which generates a laser beam which is caused to enter the optical wavelength conversion element as the fundamental wave,
   a mirror which reflects a rearward radiated laser beam radiating from the semiconductor laser in the direction opposite to said laser beam and feeds the rearward radiated laser beam back to the semiconductor laser, and
   a narrow band pass filter disposed in the optical path of the rearward radiated laser beam,
   wherein a resonator is formed between a front end surface of the semiconductor laser and the mirror.

* * * * *